(12) United States Patent
Zawada et al.

(10) Patent No.: US 10,008,660 B2
(45) Date of Patent: Jun. 26, 2018

(54) GENERATOR UNIT FOR ENERGY HARVESTING WITH A SINGLE FORCE INPUT POINT

(71) Applicant: Meggitt A/S, Kvistgaard (DK)

(72) Inventors: Tomasz Zawada, Frederiksberg (DK);
Xu Ruichao, Copenhagen SV (DK);
Michele Guizzetti, Helsingor (DK);
Louise Moller Borregaard,
Copenhagen O (DK); Henryk Roguszczak, Wroclaw (PL)

(73) Assignee: MEGGITT A/S, Kvistgaard (DK)

( * ) Notice: Subject to any disclaimer, the term of this patent is extended or adjusted under 35 U.S.C. 154(b) by 255 days.

(21) Appl. No.: 14/652,042

(22) PCT Filed: Dec. 13, 2013

(86) PCT No.: PCT/EP2013/076580
§ 371 (c)(1),
(2) Date: Jun. 12, 2015

(87) PCT Pub. No.: WO2014/091005
PCT Pub. Date: Jun. 19, 2014

(65) Prior Publication Data
US 2016/0197262 A1    Jul. 7, 2016

(30) Foreign Application Priority Data

Dec. 14, 2012 (EP) ..................... 12197157

(51) Int. Cl.
*H01L 41/113* (2006.01)
*H02N 2/18* (2006.01)
(Continued)

(52) U.S. Cl.
CPC ...... *H01L 41/1136* (2013.01); *H01L 41/1138* (2013.01); *H02K 7/1846* (2013.01);
(Continued)

(58) Field of Classification Search
CPC ............ H02N 2/18; H02N 2/186; H02N 1/08; H02N 11/00; F03G 7/08; H01L 41/1136;
(Continued)

(56) References Cited

U.S. PATENT DOCUMENTS

| 6,838,794 B2 * | 1/2005 | Iwamoto ................. F16C 9/02 310/168 |
| 7,696,673 B1 | 4/2010 | Yavid |

(Continued)

FOREIGN PATENT DOCUMENTS

| JP | 2002369554 A * | 12/2002 |
| WO | 2007121380 A2 | 10/2007 |

(Continued)

OTHER PUBLICATIONS

Search Report and Written Opinion for PCT/EP2013/076580, dated Apr. 24, 2014.
(Continued)

*Primary Examiner* — Edgardo San Martin
(74) *Attorney, Agent, or Firm* — Brinks Gilson & Lione

(57) ABSTRACT

A generator unit to harvest energy from motion is disclosed which comprises a support (6) with a connection member (7) for attachment to a movable object (8), at least a first body (3) and a second body (9) supported by the support and configured to move relatively to each other and with a varying, preferably magnetic field (4) spatially in between, one of the first or second body comprising at least one electricity generating member (2) of piezoelectric, electromagnetic or electrostatic type to produce electricity when mechanically deformed or moved, and a field engagement part (5) configured to move in the varying field when the first and second bodies move relatively to each other and generate a varying mechanical deformation or movement of the electricity generating member.

22 Claims, 16 Drawing Sheets

(51) Int. Cl.
*H02K 35/02* (2006.01)
*H02K 7/18* (2006.01)
*H01L 41/08* (2006.01)
*H02N 2/00* (2006.01)

(52) U.S. Cl.
CPC .............. *H02K 35/02* (2013.01); *H02N 2/18* (2013.01); *H01L 41/1134* (2013.01)

(58) Field of Classification Search
CPC ............ H01L 41/1138; H01L 41/1134; H01L 41/113; H01L 41/04; H02K 7/1846; H02K 7/1807; H02K 35/02; H02K 35/04
USPC .................................. 310/339, 329, 330, 328
See application file for complete search history.

(56) References Cited

U.S. PATENT DOCUMENTS

| | | | | |
|---|---|---|---|---|
| 7,816,799 | B2 * | 10/2010 | Nair | F03D 80/70 290/44 |
| 7,821,183 | B2 * | 10/2010 | Rastegar | H01L 41/1136 310/339 |
| 8,134,281 | B2 * | 3/2012 | Rastegar | F03B 13/20 310/339 |
| 8,294,336 | B2 * | 10/2012 | Priya | C04B 35/493 310/339 |
| 8,492,936 | B1 * | 7/2013 | Waters | H02K 35/02 310/103 |
| 9,059,628 | B2 * | 6/2015 | Mian | H02K 57/003 |
| 9,151,079 | B2 * | 10/2015 | Webb | E05B 13/108 |
| 9,184,676 | B2 * | 11/2015 | Ludois | H02N 1/00 |
| 9,343,931 | B2 * | 5/2016 | Deak | H02K 21/145 |
| 2009/0211353 | A1 * | 8/2009 | Gao | B60C 23/0411 73/146.5 |
| 2010/0032946 | A1 * | 2/2010 | Begley | H02K 35/02 290/3 |
| 2010/0052324 | A1 * | 3/2010 | Priya | C04B 35/493 290/50 |
| 2010/0127500 | A1 * | 5/2010 | Yang | F03B 13/20 290/53 |
| 2011/0074162 | A1 | 3/2011 | Cottone et al. | |
| 2012/0267982 | A1 * | 10/2012 | Carman | H02N 2/186 310/318 |
| 2013/0020806 | A1 * | 1/2013 | Hsu | F03G 7/08 290/54 |
| 2014/0191624 | A1 * | 7/2014 | Jahshan | H02K 35/02 310/68 B |
| 2014/0339943 | A1 * | 11/2014 | Peczalski | H02K 7/1807 310/113 |
| 2014/0360547 | A1 * | 12/2014 | Ribarov | H02N 2/186 136/205 |
| 2015/0035409 | A1 * | 2/2015 | Procopio | H02N 2/181 310/319 |
| 2015/0084482 | A1 * | 3/2015 | Yeatman | H02K 7/1892 310/319 |
| 2015/0180375 | A1 * | 6/2015 | Kleipa | H02N 2/18 310/339 |
| 2015/0375028 | A1 * | 12/2015 | Oteman | A63B 21/0628 482/2 |
| 2016/0233413 | A1 * | 8/2016 | Zawada | H01L 41/053 |
| 2016/0254725 | A1 * | 9/2016 | Angelis | H02K 7/08 310/156.08 |
| 2016/0268930 | A1 * | 9/2016 | Viala | H02N 2/18 |
| 2016/0276914 | A1 * | 9/2016 | Peroulis | H02K 7/1876 |
| 2016/0336835 | A1 * | 11/2016 | Bickers | H02K 21/24 |
| 2017/0110988 | A1 * | 4/2017 | Izumi | H02N 1/08 |

FOREIGN PATENT DOCUMENTS

| | | | | |
|---|---|---|---|---|
| WO | | 2011052106 A1 | 5/2011 | |
| WO | WO | 2011059129 A1 * | 5/2011 | ............. H02N 2/18 |
| WO | | 2012164545 A1 | 12/2012 | |
| WO | WO | 2012164545 A1 * | 12/2012 | ......... H01L 41/1136 |
| WO | WO | 2015154176 A1 * | 10/2015 | ............. H02N 2/18 |

OTHER PUBLICATIONS

International Preliminary Report on Patentability for PCT/EP2013/076580, dated Sep. 29, 2014.

* cited by examiner

GENERATOR UNIT FOR ENERGY HARVESTING WITH A SINGLE FORCE INPUT POINT

RELATED APPLICATIONS

This application claims the benefit under 35 U.S.C. § 371 of International Patent Application No. PCT/EP2013/076580, having an international filing date of Dec. 13, 2013, which claims priority to European Application No. 12197157.6, filed Dec. 14, 2012, the contents of both of which are incorporated herein by reference in their entirety.

FIELD OF INVENTION

This invention relates to a generator unit configured to harvest energy when being attached at a single point of contact to an object in motion and comprising: a support comprising one connection member configured to attach to and to provide a single point of contact to a movable object, at least a first body and second body supported by the support and configured to move relatively to each other and with a varying field spatially in between; with either first or second body comprising at least one electricity generating member—a piezoelectric, electromagnetic, electrostatic or an electrostrictive type—configured to produce electricity when mechanically deformed or moved and with a field engagement part configured to move in the varying field when the first and second bodies move relatively to each other generating a varying mechanical deformation or movement of the electricity generating member.

BACKGROUND OF THE INVENTION

This invention relates to generation of electricity and generally generation of electricity in autonomous systems.

Any generator requires a source of energy. In an aspect of this invention, the source of energy is the energy "freely" available due to an object already in motion. That is if the object is propelled by some means or in motion due to external forces which includes natural forces such as wind and waves or excess mechanical energy from the industrial machinery.

By motion is understood some relative movement of objects caused by vibrations, rotations, linear movements and acceleration.

WO 2012/164545 discloses a device for energy harvesting from an impact by using a piezoelectric MEMS scavenger comprising at least a gear with teeth driven by an inertial mass system and a piezoelectric transducer located next to the gear. In a potential application is the impact-type piezoelectric energy harvester array integrated with a commercially available mechanical watch mechanism consisting of an oscillating mass and a multi-toothed gear wheel. Motion causes the heavy mass to move and mechanical energy recovered from the oscillating mass will be converted into usable electrical energy by the piezoelectric harvester.

A generator based on piezoelectric harvesting will often be used in application where it is not possible to change a battery and where the wanted lifetime of the application is longer than what can be achieved by any battery. A mechanical contact between the gear and the piezoelectric harvester as described above will overtime cause wear and tear of the gear teeth and the tip of the piezoelectric harvester which will limit the lifetime of the generator. One aspect of this invention is to avoid the wear and tear due to the mechanical contact and thereby prolong the lifetime of the generator.

In particular, the invention relates to the generation or harvest of energy from movements at low frequencies and harvest over longer periods of time. However, the invention is not limited to such low frequencies although movements or vibrations of that type provide the most common situations.

Another aspect of the invention is to reduce the technical efforts needed to arrange a generator to produce energy or harvest energy. Thus, another object is to reduce complexity of such arrangement.

SUMMARY

An object of this invention is achieved by a generator unit configured to harvest energy when being attached at a single point of contact to an object in motion, said generator unit comprising a support comprising one connection member configured to attach to and to provide a single point of contact to a movable object and at least a first body and second body supported by the support and configured to move relatively to each other and with a varying field spatially in between; with either first or second body comprising at least one electricity generating member—piezoelectric, electromagnetic, electrostatic, or electrostrictive—configured to produce electricity when mechanically deformed or moved and with a field engagement part configured to move in the varying field when the first and second bodies move relatively to each other and generate a varying mechanical deformation or movement of the electricity generating member.

Thereby is provided a generator unit that can easily be placed on an object to harvest energy due to the motion of the object. The movement of the two bodies will result in a deformation or movement of the electricity generating member—being piezoelectric, electromagnetic, or electrostatic or electrostrictive—due to the varying field probed by the field engagement part.

This invention also relates to a generator unit configured to harvest energy when in motion and comprising: a support comprising one connection member configured to attach to a movable object, at least a first body and second body supported by the support and configured to move relatively to each other and with a varying field spatially in between; with either first or second body comprising at least one electricity generating member—a piezoelectric, electromagnetic, electrostatic or an electrostrictive type—configured to produce electricity when mechanically deformed or moved and with a field engagement part configured to move in the varying field when the first and second bodies move relatively to each other and generate a varying mechanical deformation or movement of the electricity generating member.

Although not exclusive, the invention is at least useful when the motion experiences vibrations or rotations comprising rotational speeds or frequencies in a range, a spectrum or distinct. Typical rotational speeds are in the range of 0.1 RPM-6000 RPM for a rotational environment.

The rotational energy harvester system can also harvest energy from slow back and forth motions such as piston action, e.g. a pendulum system. The typical operating frequency from these motions will be around 0.001 Hz to 2000 Hz.

The person skilled in the art will appreciate, that a particular mechanical configuration will work at some frequencies or rotational speeds and design the electrical system accordingly or vice versa.

The piezoelectric member is made of a piezoelectric material such as lead zirconate titanate (PZT), which is a good choice with respect to the properties of the material and the relatively low cost.

In an alternative embodiment, piezoelectric materials such as single crystals (PNM-PT), which has very high elastic coefficient, but is relatively more expensive and not suitable for higher temperatures can be used.

In other embodiments KNN, AlN or even quartz can be used for the piezoelectric member.

Furthermore, the cantilever beams currently in use are bimorph beams, i.e. two active PZT layers. However, unimorph beams, with one active PZT layer and another passive support layer of inactive PZT or other material, may also be used. To further improve the setup, a multilayered structure for the cantilever beams may be used.

One specific example of usage of the invention is energy harvesting solutions in combination with wireless systems.

Wireless monitoring and sensing systems offer several advantages compared to their wired counterparts.

In health care, for instance, a patient with a wireless monitoring system may still be mobile, while a wired monitoring system leaves the patient rather immobile.

Wireless and battery-less solutions can benefit many of the industrial applications, e.g. vibration, pressure, temperature, corrosion, humidity strain monitoring, which would reduce the cost of maintenance (no need to replace batteries). They would also enable solutions, where the sensors could be built-in into the structure of the object to be monitored. For example, fuselage of an aircraft, rotorcraft system, part of the mechanical structure, internal rotating parts of a gear box. Another advantage of using energy harvesting solution is the ease of deployment of the sensors or devices.

This includes usage in harsh environments, where there is a high pressure and/or high/low temperature, so the batteries will not be able to operate.

Practical examples are tire pressure monitoring or vibration monitoring of a rotation shaft, where the rotation of the part makes electrical wires unfavourable. Localised energy harvesting also enables full encapsulation of the devices/sensors, since it removes the need to open the housing in order to access the battery compartment.

There is no need to provide any electrical connection for recharging, since the energy is produced and consumed inside the housing.

In one or more embodiments of the invention, either the first or second body has a counterweight.

This will further enhance the relative movement of the bodies as the counterweight result in increased inertia. This will increase the energy transfer by increased momentum and subsequent swings.

In one or more embodiments of the invention, the counterweight is a mass configured to provide a counter balance and to act as a second point of contact due to the force provided by gravity to the counterweight.

It is understood that the counterweight is a mass that is provided on either body with the purpose of providing a second point of reference using gravity.

That said, a counterweight can be implemented as by increasing the weight of a part of the body by using more material. It is also possible to decrease the weight of other parts of the body, thus further move the center of gravity from the rotational axis.

In a special version there are means for connecting a counterweight of different weights and at different positions. Thereby, the counterforces provided by the counterweight can be adjusted according to the forces acting on the field engagement part in the varying field for specific motions.

In one or more embodiments of the invention the varying field may be adjustable relative to the field engagement part. In such embodiment, the varying field may be changed or alternated by adjusting a field variation member. In a particular embodiment, the field variation may be provided by mechanically adjusting a bias, which may be provided by adjusting a distance between the field engagement part and varying field.

In one or more embodiments of the invention, the varying field is a magnetic field provided by at least one permanent magnet on one body and the field engagement part on the electricity generating member on the other body is a ferromagnetic material or a permanent magnet.

Thus providing a robust implementation, where there is no mechanical contact of the field engagement part and the field generating member. In one or more embodiments of the invention, the varying field may be generated by a magnetic field with opposite magnetic orientations, thereby, in an efficient manner, providing a varying field that effectively makes a large variation.

A person skilled in the art will appreciate that the arrangement of magnets can be changed and optimised according to the actual implementation. In some cases, magnets can advantageously be placed close together and in other cases magnets can advantageously be arranged with more space in between.

Also, a person skilled in the art will appreciate that the number of magnets required can be optimised to ensure a maximum of energy production per used magnet or per cost of magnets.

The number of the magnets may be considered a frequency multiplier, and the lower the frequency the more necessary it is to have them.

In one or more embodiments of the invention, the varying field may be generated by a magnetic field with the same magnetic orientations, thus providing a configuration that is particularly suited for either repelling or attracting.

However, in most cases having only repulsive configuration in the magnetic setup provides more mechanical stability since no "pull-in" effect will be present.

In one or more embodiments of the invention, the counterweight is made of a non magnetic material.

Using a non magnetic material ensures that the counterweight will not have any undesirable effect on the magnetic field as well as the electricity generating member.

In one or more embodiments of the invention, the varying field predominantly varies perpendicularly to the rotational plane. Thus, by having an arrangement where two discs are located opposite to each other with a gap in between results in a robust implementation that can be made flat.

This can be made by a disc structure facing another disc structure. In a special embodiment, the gap between the discs can be varied.

In one or more embodiments of the invention, the first body is configured as a disc with a centre for receiving a bearing to be attached to the support having a sequence of permanent magnets placed in the periphery of the disc, the first body facing the second body (9) also formed as a disc having an adjustable distance between them.

A person skilled in the art will appreciate the possibility of varying the strength of the magnetic field between the two disc structures by varying the gap between the two discs before, during or after the generator unit is attached to an object. Thus, providing a generator unit usable within applications where the level of generated electricity has need of being regulated during mounting or use.

In one or more embodiments of the invention, the generator unit is configured for adjusting the strength of the magnetic field by means of using different magnetic materials for the permanent magnets.

Also, a person skilled in the art will appreciate the possibility of varying the strength of the magnetic field between the two disc structures by means of using different magnetic materials, thus providing a generator unit which level of generated electricity can be varied without changing any physical dimensions.

In one or more embodiments of the invention, the first body has an inner side facing the second body and an outgoing side comprising the counterweight so that the minimal distance between the two discs is not limited by having the counterweight in between them.

In one or more embodiments of the invention, the generator unit is configured for adjusting the mass of the counterweight.

In one or more embodiments of the invention, a substantial part of the mass of the counterweight is tungsten. Tungsten has been found to particular suitable. One advantage is the relative high mass density and a person skilled in the art will appreciate such other high mass density materials. A further advantage is the magnetic properties of tungsten allowing for a high mass without altering or significantly altering the varying field as provided. Another advantage is that tungsten is easy to form with a binder.

In an embodiment a tungsten powder or small balls are used to form and shape a using a binder such as epoxy. This allows for easy and flexible shapes to easy form a counterweight suitable in weight and placement.

Alternative a casting of tungsten may be used to achieve a higher density.

In this fashion it is event possible to further control the mass density.

In one or more embodiments of the invention, the electricity generating member may be a cantilever connected to a body.

The use of a cantilever provides a flexible and robust implementation of the invention.

The cantilever can be a beam such as a bimorph beam, a unimorph beam, or a multilayer beam.

It is understood that the cantilever is attached or anchored to a body at some point and preferably at an end.

In one or more embodiments of the invention, the electricity generating member may be a bridge having two anchor points to a body.

The bridge can likewise be a beam such as a bimorph beam, a unimorph beam, or a multilayer beam.

Moreover, the cantilever or bridge can be anchored at multiple points or along a fixation line or curve.

In one or more embodiments of the invention, the electricity generating member may be a membrane anchored to a body.

In a particular embodiment the electricity generating member is formed as a membrane. In one case the membrane is attached or anchored at the periphery. In this case the field engaging member is in a centre part.

In another case the membrane is attached or anchored at the centre part with the field engaging member at the periphery.

In one or more embodiments of the invention, the varying field and the field engagement part are configured to deform the electricity generating member bi-directionally or uni-directionally relatively to an equilibrium position or wherein the varying field and the field engagement part are configured to either repel or attract each other or alternatively repel and attract each other.

Thereby, the cantilever, bridge or membrane can deform in different directions, thus providing for electricity generation when deforming in each direction.

Having only deformation in one direction provides for a mechanically more robust configuration since the anchoring can be made so that the forces emerging due to the deformation are taken by a body. I.e. the cantilever is pressed against a body at the anchor point. According to an embodiment of the invention, the generator unit is special in that the first body and the second body are configured to move relatively to each other as a rotation; preferably about a mutual axis.

In an embodiment, each body has a face and the faces are arranged to rotate relative to each other.

In one or more embodiments of the invention, the varying field predominantly varies radially in the rotation. Thus, by having an arrangement, where a body rotates around another body providing a field that is well suited for energy caption from rotation of the bodies relative to each other. This can be made by a ring structure surrounding another ring structure.

In one or more embodiments of the invention, the said generator unit may comprise multiple bodies and in between the bodies multiple varying fields with multiple electricity generating members.

Thus, there is provided an effective use of a single support and housing.

In one or more embodiments of the invention, the support may have a gimbal type support configured to support the bodies in a preferred orientation as the single connection member changes orientation in a relatively slow movement of an object compared to the energy harvesting motion. Thereby enabling a flexible connection point to an object so that the bodies can orient by the gravitational forces independent of the point of connection to an object.

In one or more embodiments of the invention, the generator unit may have a housing with an interior configured to encapsulate the mentioned elements and an exterior with a single means of connection to an object.

Thereby, a single generator unit is provided, where the housing can have a suitable connection point to an object on the exterior of the housing and inside two bodies and an electricity generating member are arranged as disclosed for harvesting energy from the object to which the generator unit is attached.

In one or more embodiments, the generator unit may have a varying field and electricity generating members that are asymmetrically arranged against each other.

Thus providing a smoother electricity generation where the unit does not simultaneously feel one large accumulated force from all generating members at the same time, but rather one at a time as the first and second body move relatively to each other.

An asymmetrical configuration will also reduce the force or load on the counterweight and minimize or reduce the required size of the counterweight.

In an embodiment, four cantilevers are distributed unevenly, say between 87- to 93-degrees, apart and the varying field is peaking say 90-degrees apart, thus this embodiment will not load the counterweight simultaneously.

It has been found that this works with about 60 magnets on the first body (i.e. spaced apart by 6-degrees), although a person skilled in the art will find it natural to vary the numbers and spacing on each body.

A person skilled in the art will appreciate that an asymmetrical generator can be made by introducing certain asymmetry between the arrangement of the sources of the varying field and the electricity generating members on the first and second body.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will, thus, not be described in detail with respect to the description of each figure.

BRIEF DESCRIPTION OF DRAWINGS

Embodiments of the invention will be described in the figures, whereon.

DETAILED DESCRIPTION

| Part No. | Description |
|---|---|
| 1 | Generator unit |
| 2 | Electricity generating member |
| 3 | First Body |
| 4 | Varying field |

-continued

| Part No. | Description |
|---|---|
| 5 | Field engagement part |
| 6 | Support |
| 7 | Single connection member |
| 8 | Object |
| 9 | Second body |
| 10 | Housing |
| 11 | Bearing |
| 12 | Counterweight |
| 13 | Distance |
| 14 | Inner side |
| 15 | Outer side |
| 16 | Tungsten |
| 17 | Cavity |
| 18 | Cover |
| 20 | Cantilever |
| 21 | Anchor point |
| 22 | Anchor |
| 23 | Top electrode |
| 24 | Piezoelectric Layer |
| 25 | Bottom electrode |
| 26 | Cantilever support |
| 27 | Deform direction |
| 30 | Bridge |
| 40 | Membrane |
| 50 | Magnetic field |
| 51 | Magnetic orientation |
| 52 | Permanent magnet |
| 53 | Equilibrium |
| 54 | Attracting deformation |
| 55 | Repelling deformation |
| 60 | Perpendicular deformation |
| 62 | Parallel deformation |
| 64 | Angled deformation |
| 70 | Symmetrical arrangement |
| 72 | Asymmetrical arrangement |
| 80 | Electromagnetic configuration |
| 82 | Movable magnet |
| 84 | Coil |
| 90 | Electrostatic configuration |
| 92 | Electrode pair |

Figure 1:
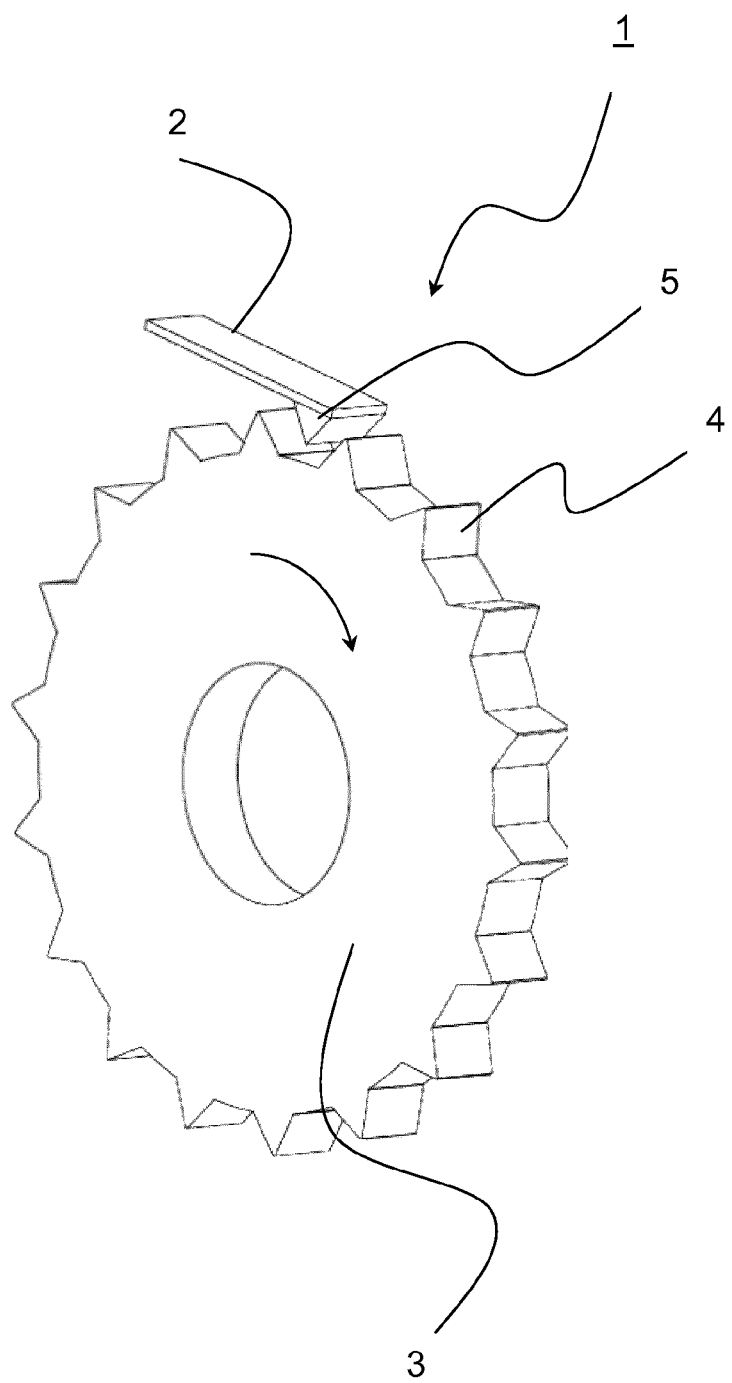
FIG. 1 shows part of a generator unit with an electricity generating member.

FIG. 1 shows part of a generator unit 1 with an electricity generating member 2 that interacts with a first body 3 configured to be driven by some external force. The electricity generating member 2 and the first body 3 are arranged so that the interaction between the electricity generating member 2 and the first body 3 results in that the electricity generating member 2 flexes when the first body 3 rotates. This is due to the teeth arrangement that creates a potential varying field 4 that interacts with a pickup that acts a field engagement part 5.

Figure 2:
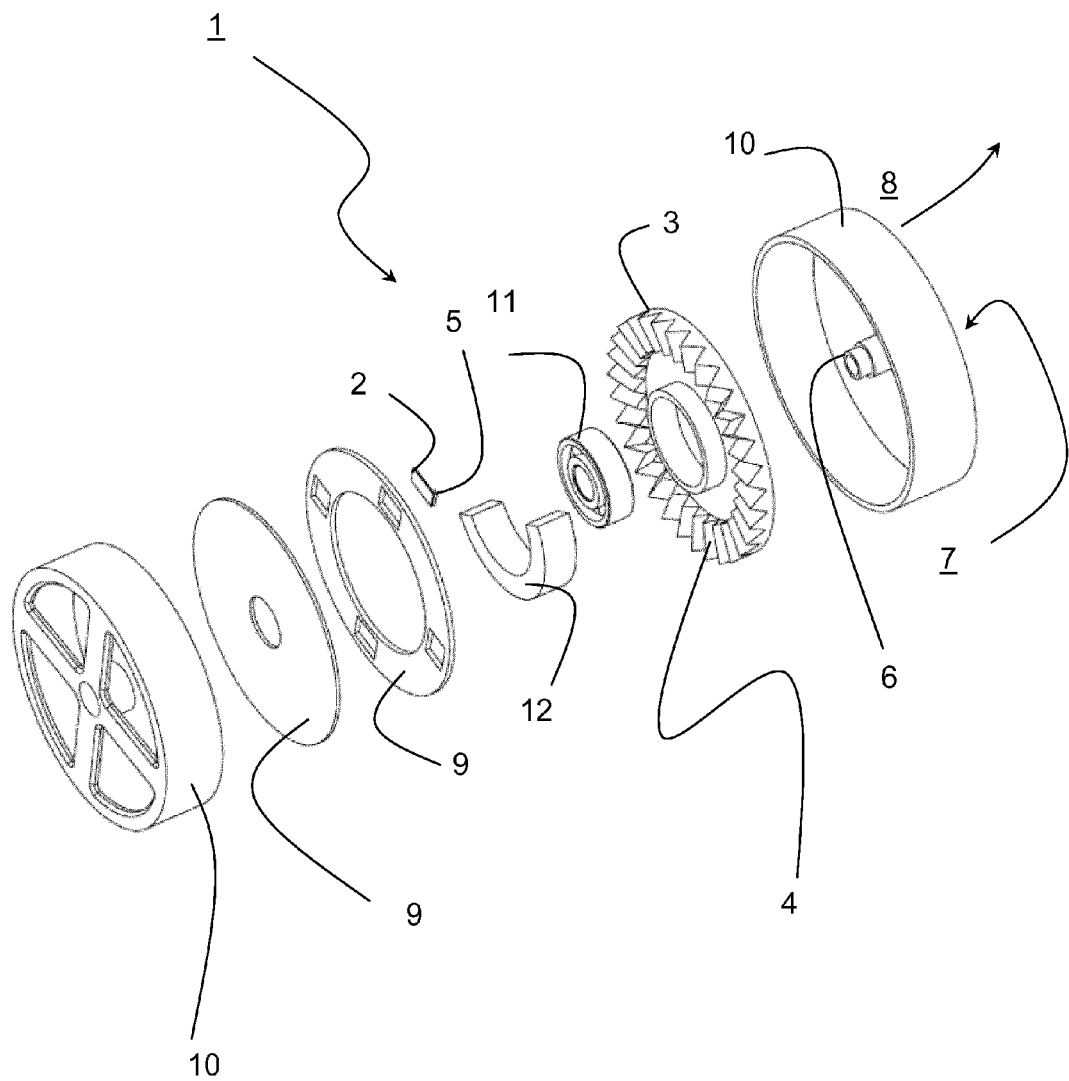
FIG. 2 shows a generator unit with a support and a single connection member for attachment to an object.

FIG. 2 shows a particular embodiment of a generator unit 1 comprising a support 6 with the single connection member 7 for attaching the generator unit 1 to a movable object 8 that is not part of the invention.

This embodiment has a first body 3 configured with means to generate a varying field 4 and a field engagement part 5 configured to interact with the varying field 4. The field engagement part 5 is attached to an electricity generating member 2 attachable to a second body 9, which here is a two part body.

This embodiment further has a bearing 11 between the first body 3 and the second body 9—via the support 6—for smoother movement of the second body 9 relative to the first body 3.

Furthermore, this embodiment has a counterweight 12 attachable here to the first body 3 to provide inertia when the generator unit is moved.

Finally, there is a housing 10 configured to enclose the parts and bodies and to protect those as well as defining a single generator unit 1.

In this embodiment, the varying field 4 is established by spatial deformations on the first body 3 facing the field engagement part 5 on the second body 9. The spatial deformations are teeth on a disc and the field engagement part 5 is a pick-up type configuration adapted to transform the varying field 4 to bending of a piezoelectric member as the electricity generating member 2.

Figure 3:
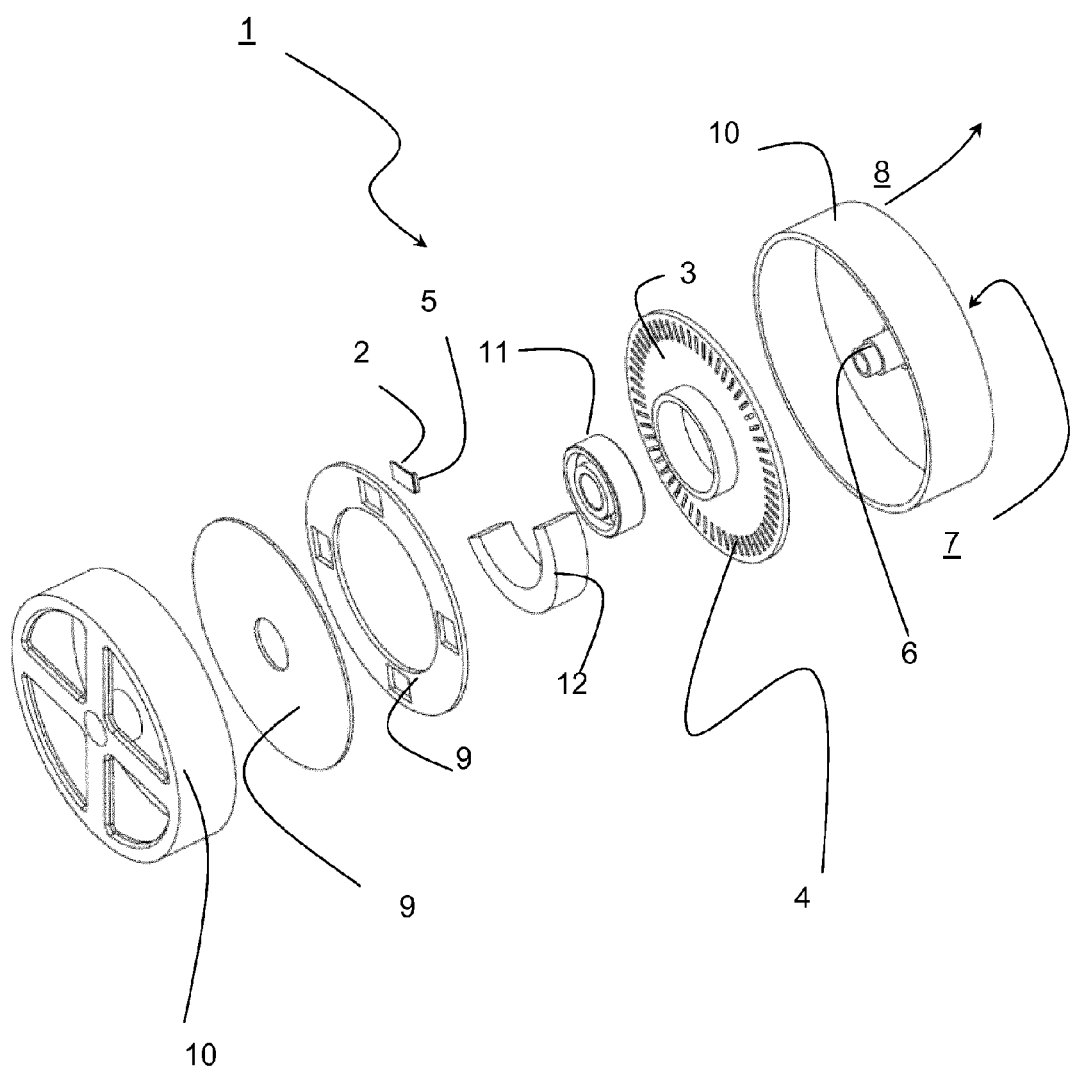
FIG. 3 shows an alternative generator unit.

FIG. 3 shows an alternative embodiment to the embodiment from FIG. 2. In this embodiment, the varying field 4 is a magnetic field generated by a sequence of permanent magnets placed in the periphery of the disc implementation of the first body 1. The field engagement part 5 is a permanent magnet or a ferromagnetic material configured to sense the spatial variation of the magnetic field.

Figure 4A:
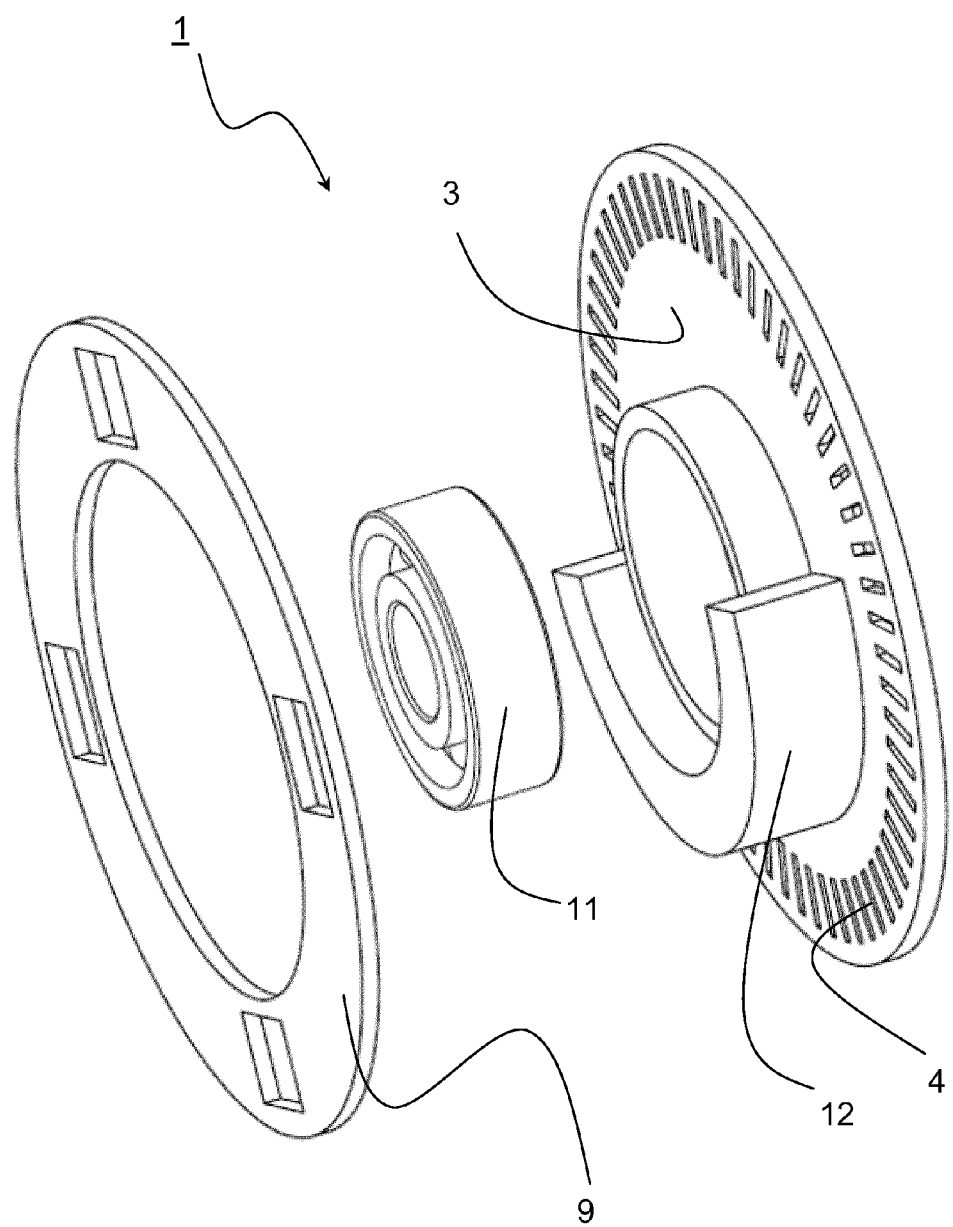
FIG. 4A shows details of the inclusion of a counterweight in a generator unit.

FIG. 4A details a particular aspect of the embodiments shown. In this case, the counterweight 12 is attached to the first body 3 configured as a disc with a centre for receiving a bearing 11 also to be attached to a support 6 (not shown here) so that the first body 3 as a disc will face the second body 9 also formed as a disc.

The second body 9 is seen to have spaces for hosting electricity generating members 2 (not show here).

Figure 4B:
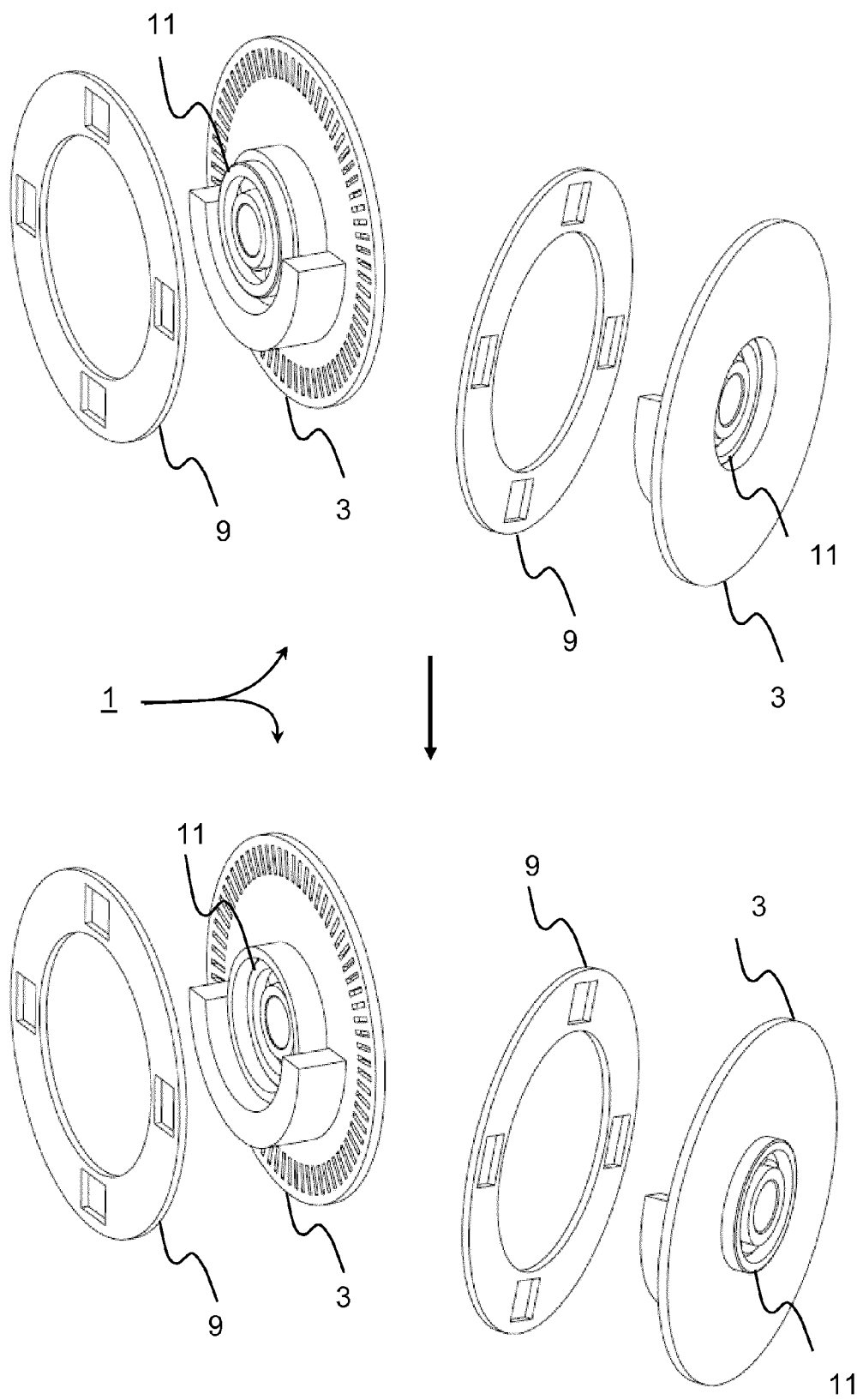
FIG. 4B shows details of the inclusion where the varying field can be varied perpendicular to the rotational plane.

FIG. 4B shows in continuation of preceding figures how the gap or distance between the first body 3 and the second body 9 can be varied by sliding the first body back or forward over the bearing 11 thereby adjusting the varying field 4 perpendicular to the rotational plane and thereby adjusting the varying field 4 relative to the field engagement part 5.

Figure 4C:
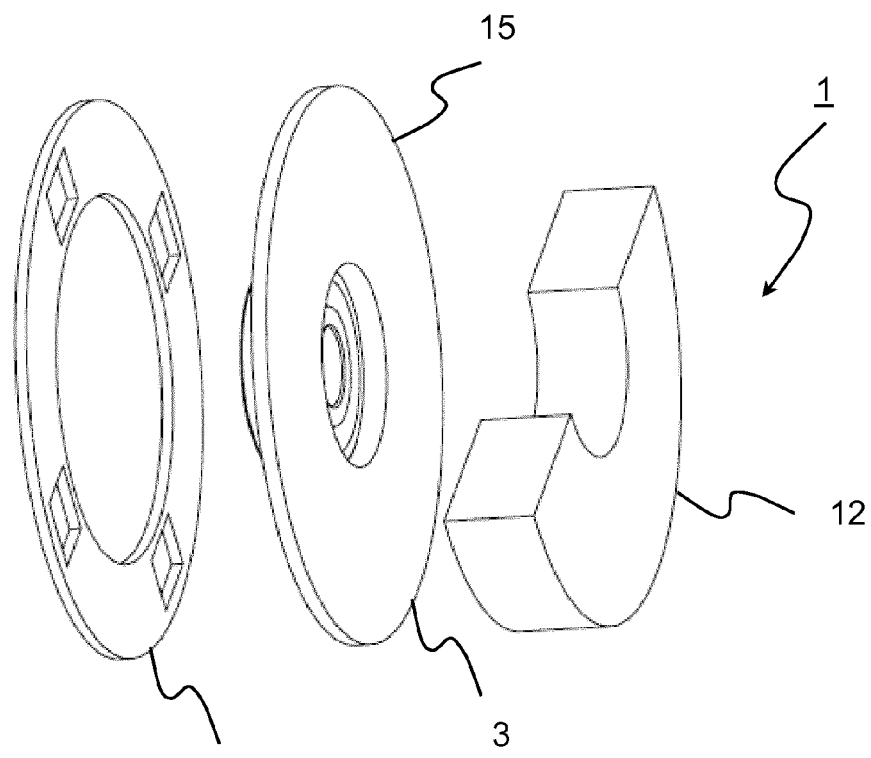
FIG. 4C shows an alternative location of the counterweight.

FIG. 4C shows an alternative location of the counterweight 12 on an outer side 15 of the first body 3 such that it is not placed in between the first body 3 and the second body 9. In this embodiment, the varying field 4 and the field engagement part 5 (not shown) can interact with no or less impact on the field by the counterweight. A further advantage is that the distance between the two discs can be adjusted over an even larger range than otherwise. Furthermore, the counterweight may become more accessable and thus changeable.

Figure 4D:
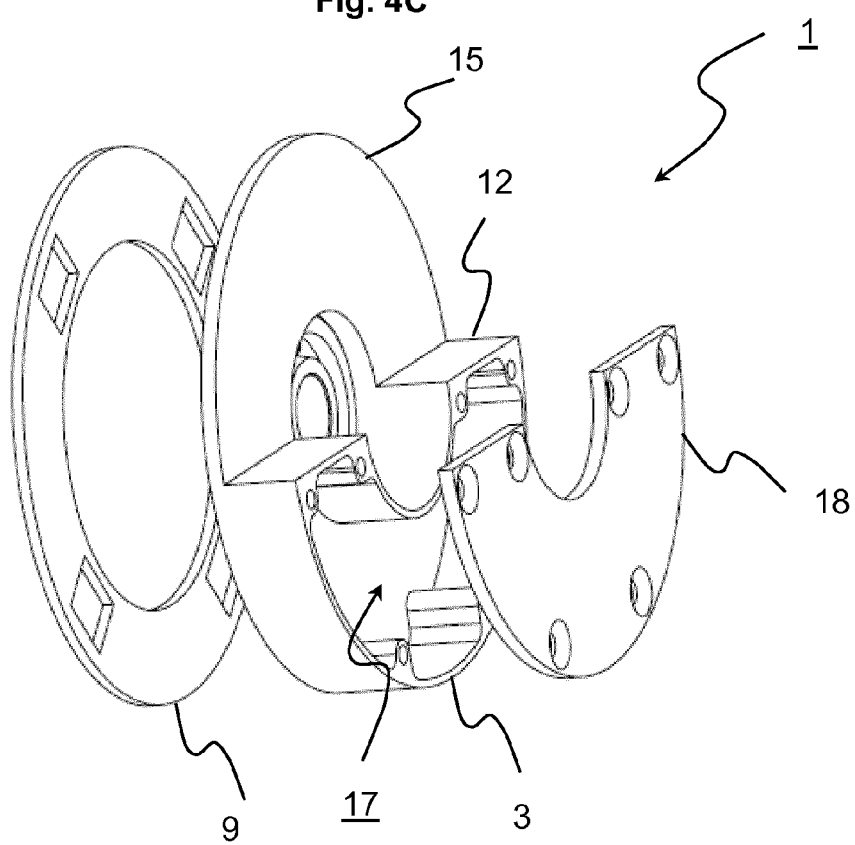
FIG. 4D shows details of a counterweight configured for a variable mass.

FIG. 4D shows details of a counterweight 12 configured for a variable mass. This by adding a cavity 17, which may be hollow to an outer side 15 of the first body 3 configured for receiving a mass and enclosing the mass with a cover 18. The cover 18 may be fixed to the first body 3 by use of screws.

Figure 5:
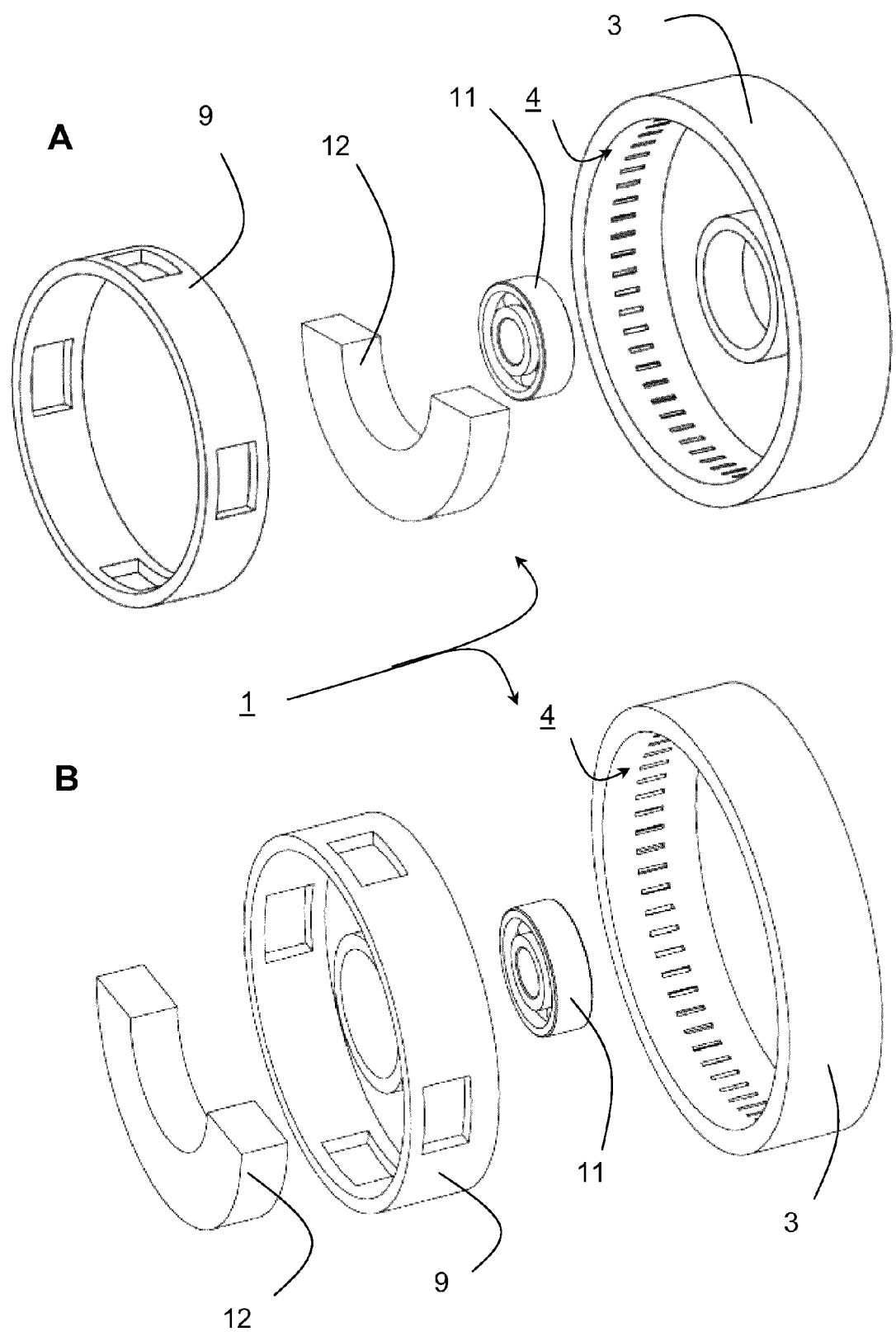
FIG. 5 shows alternative embodiments and alternative locations of a counterweight.

FIG. 5 illustrates in continuation of preceding figures alternative A and B embodiments of the first 3 and second 9 bodies as well as alternative locations of the counterweight 12.

In both A and B the first 3 and second 9 bodies are implemented as rings with the first body 3 enclosing the second body 9 and with the two rings having faces with means for generating a varying field 4 in between.

In the A implementation, the first body 3 is configured to receive the counterweight 12. In the B implementation, the second body 9 is configured to receive the counterweight 12.

Both embodiments are configured so that the varying field 4 predominantly varies radially in the rotation. The embodiments in the previous figures are configured so that the varying field 4 predominantly varies perpendicularly to the rotational plane.

A person skilled in the art will appreciate the alternative implementations and choose the one that in a particular circumstance is preferable.

Figure 6:
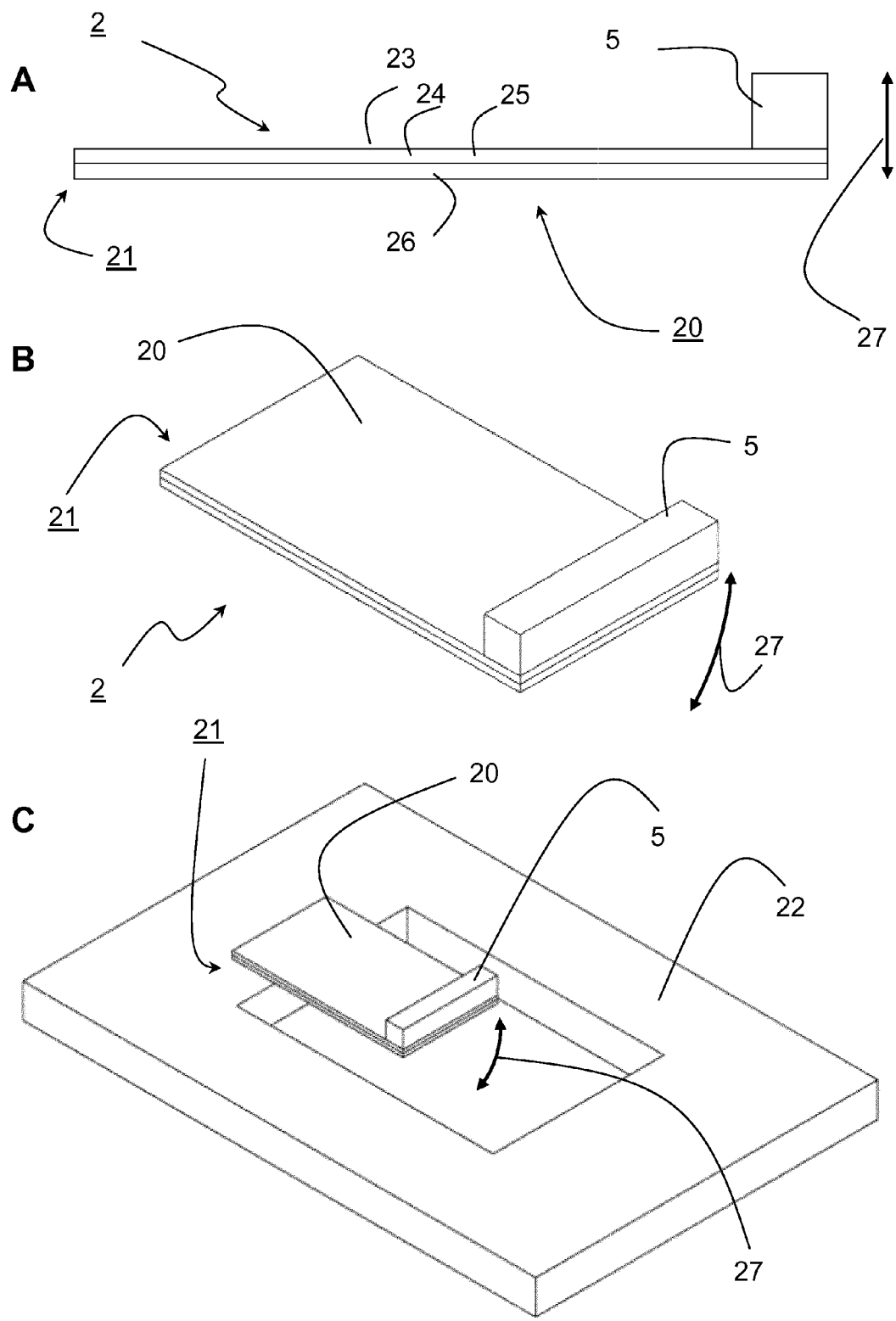
FIG. 6 shows an implementation of a cantilever with a single anchor point.

FIG. 6 shows an implementation of an electricity generating member 2 in the form of a cantilever 20 with an anchor point 21 at one end and a field engagement part 5 at an opposite end. The anchor point 21 can be attached to an anchor 22, with a space so that the cantilever 20 can flex.

The cantilever 20 is a sandwich construction with a top electrode 23, a piezoelectric layer 24 and a bottom electrode 25 on a cantilever support 26 arranged so that the field engagement part 5 can move in the varying field 4 (not shown here) and deform the cantilever 20 and hence stress the piezoelectric layer 24 in a deform direction 27.

As seen from the figure, the space in the anchor 22 is made to allow for the deformation in a deformation direction 27.

Figure 7:
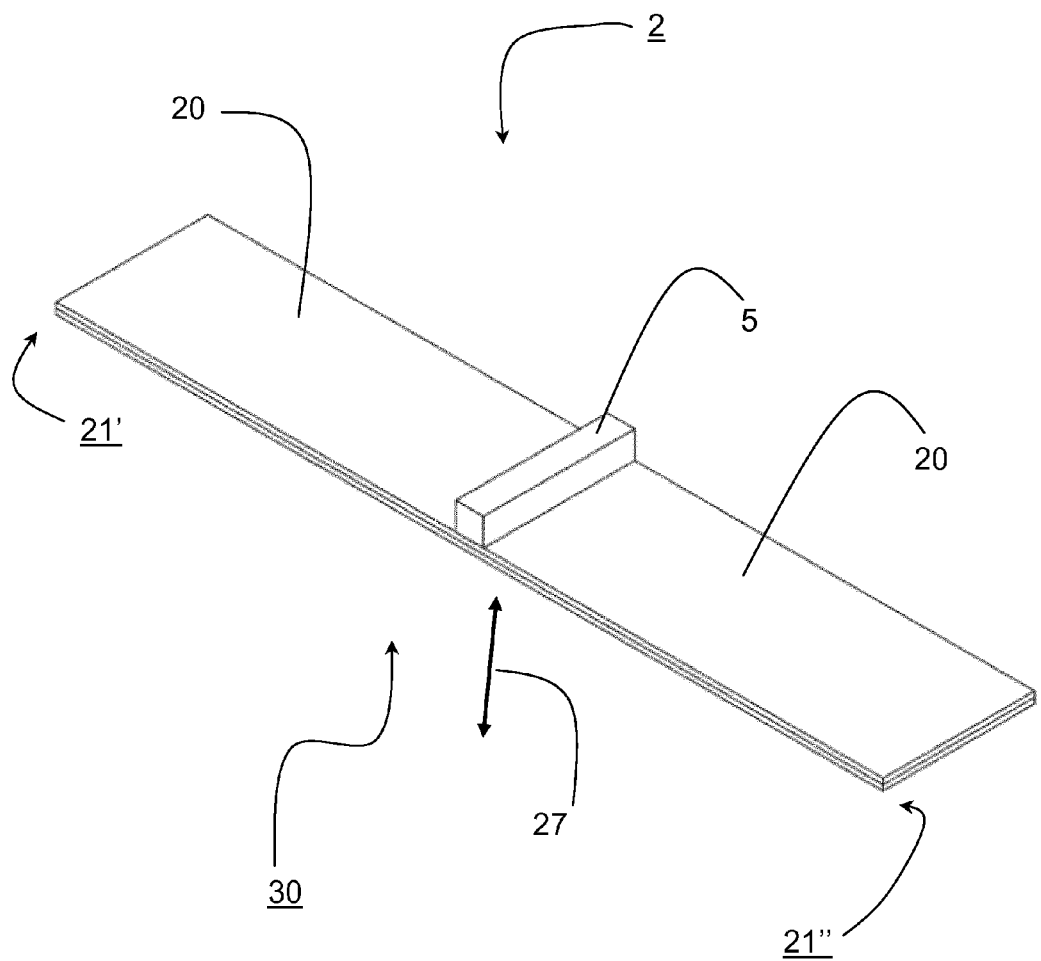
FIG. 7 shows an alternative arrangement of a bridge and its anchor points.

FIG. 7 shows an alternative embodiment of an electricity generating member 2 as a bridge 30. The bridge 30 has a first anchor point 21' at one end and a second anchor point 21" at an opposite end. In between the anchor points 21', 21" there is an field engagement part 5 that will flex or bend the bridge 30 in the centre part in a deform direction 27.

Figure 8:
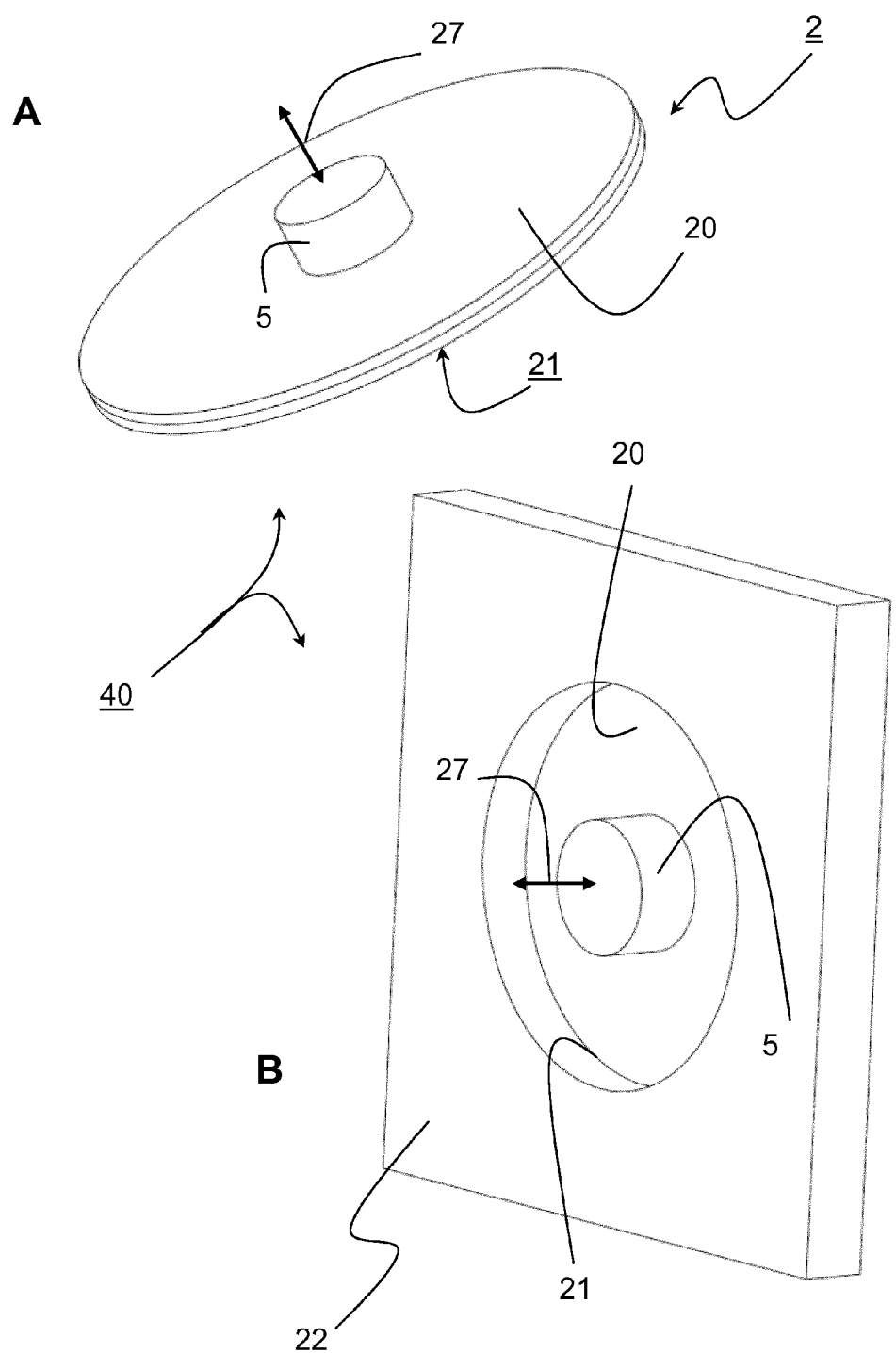
FIG. 8 shows an embodiment of the cantilever as a membrane.

FIG. 8 shows an implementation of an electricity generating member 2 where the cantilever 20 is in the form of a membrane 40 with a field engagement part 5 in a centre area. The anchor point 21 is the periphery of the membrane 40 and suitable for connecting the membrane 40 to an anchor 22 with a space that allows the field engagement part 5 to deform the membrane 40 in a deform direction 27.

Figure 9:
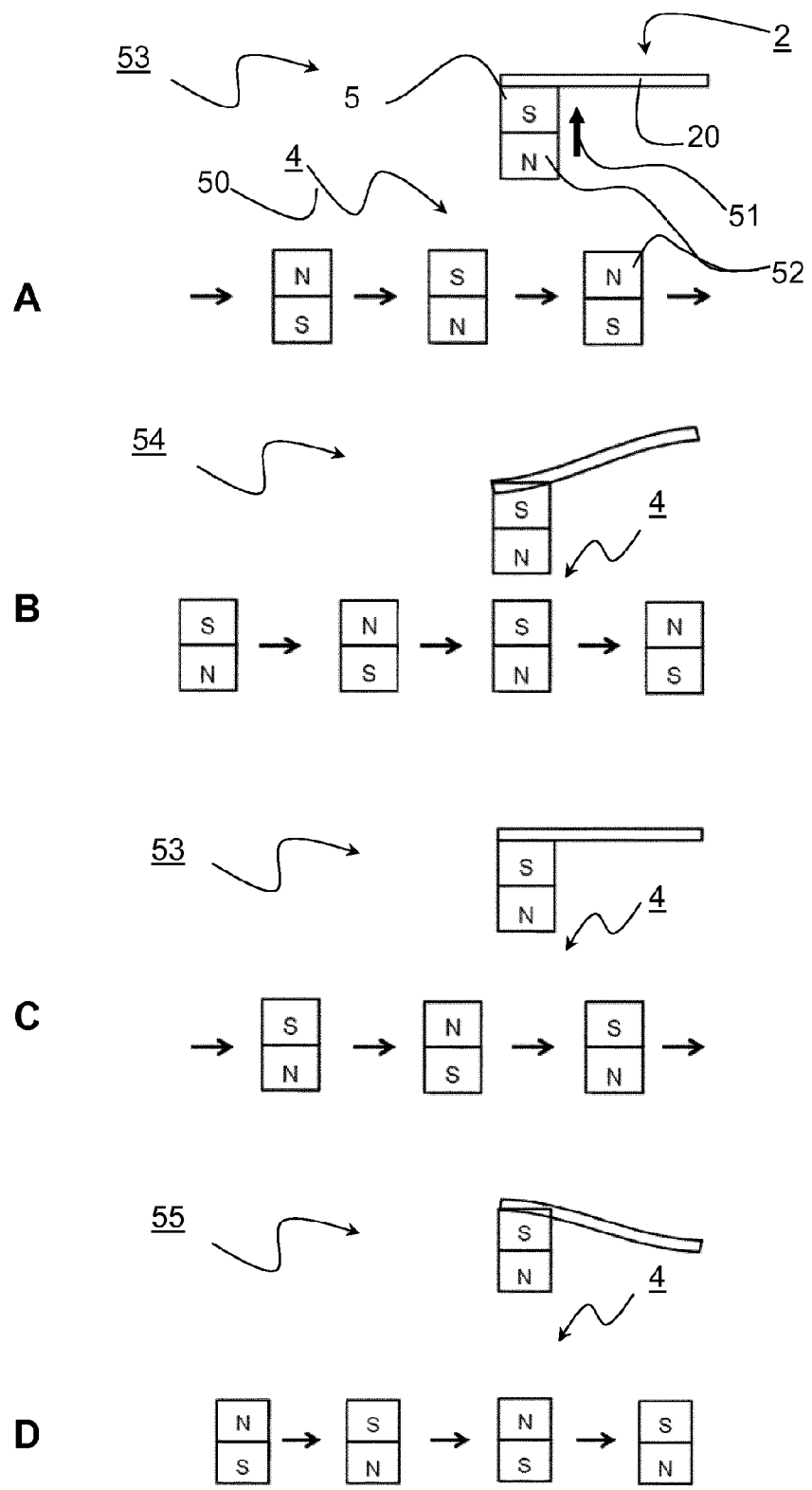
FIG. 9 shows an embodiment where the varying field is a magnetic field.

FIG. 9 shows a magnetic field 50 implementation of a varying field 4. The varying field 4 is generated by magnets with alternating magnetic orientations 51 as of permanent magnets 52. In this particular embodiment, the field engagement part 5 is located at an end of a cantilever 20 and is also a permanent magnet 52 with a magnetic orientation 51. Thus, as the series of permanent magnets 52—say being attached to a first body 3—is moved relatively to the permanent magnet 52 on the field engagement part 5 so that the deformations illustrated in A, B, C, and D occur. First, the electricity generating member 2 is in equilibrium 53, then an attracting deformation 54 as the permanent magnets attract each other, then an intermediate equilibrium 53 before a repelling deformation 55 as the permanent magnets repel each other.

Figure 10:
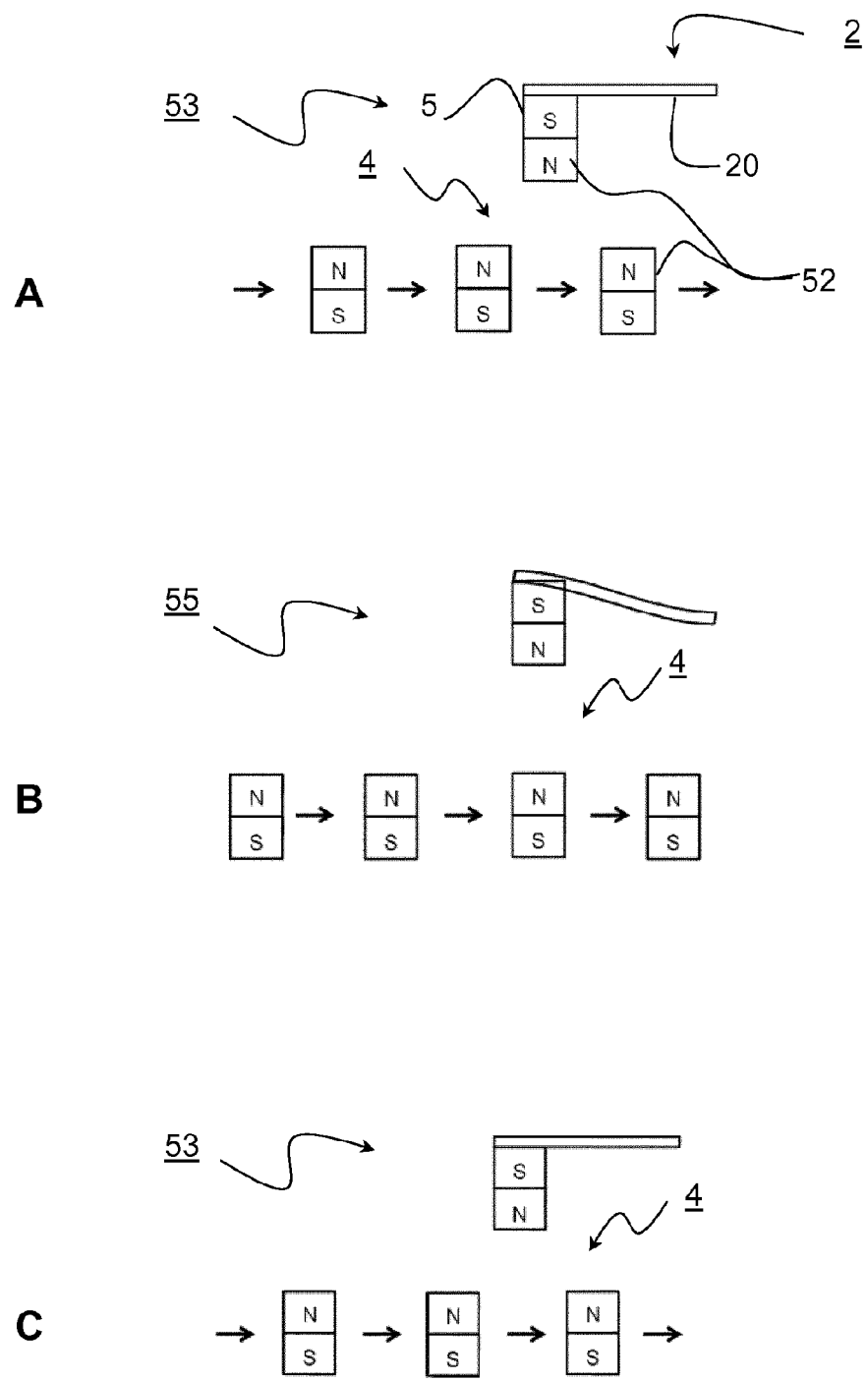
FIG. 10 shows an implementation where the magnetic field is generated by permanent magnets.

FIG. 10 illustrates an implementation of the varying field 4 based on a series of permanent magnets 52 arranged with the same magnetic orientation 51 so that the field engagement part 5, also being a permanent magnet 52, will experience, here, repelling magnetic forces as the permanent magnet 52 on the field engagement part 5 has a magnetic orientation 51 opposite to the series of permanent magnets 52.

As the series of permanent magnets 52 moves relatively to the permanent magnet 52 on the field engagement part 5 the cantilever 20 will alternate between an equilibrium 53 position and a repelled deformation 55.

In this embodiment, the cantilever 20 with the field engagement part 5 is arranged so that the equilibrium 53 position is when the magnetic field strength of the varying field 4 is minimal. The equilibrium 53 position can be optimised.

Figure 11:
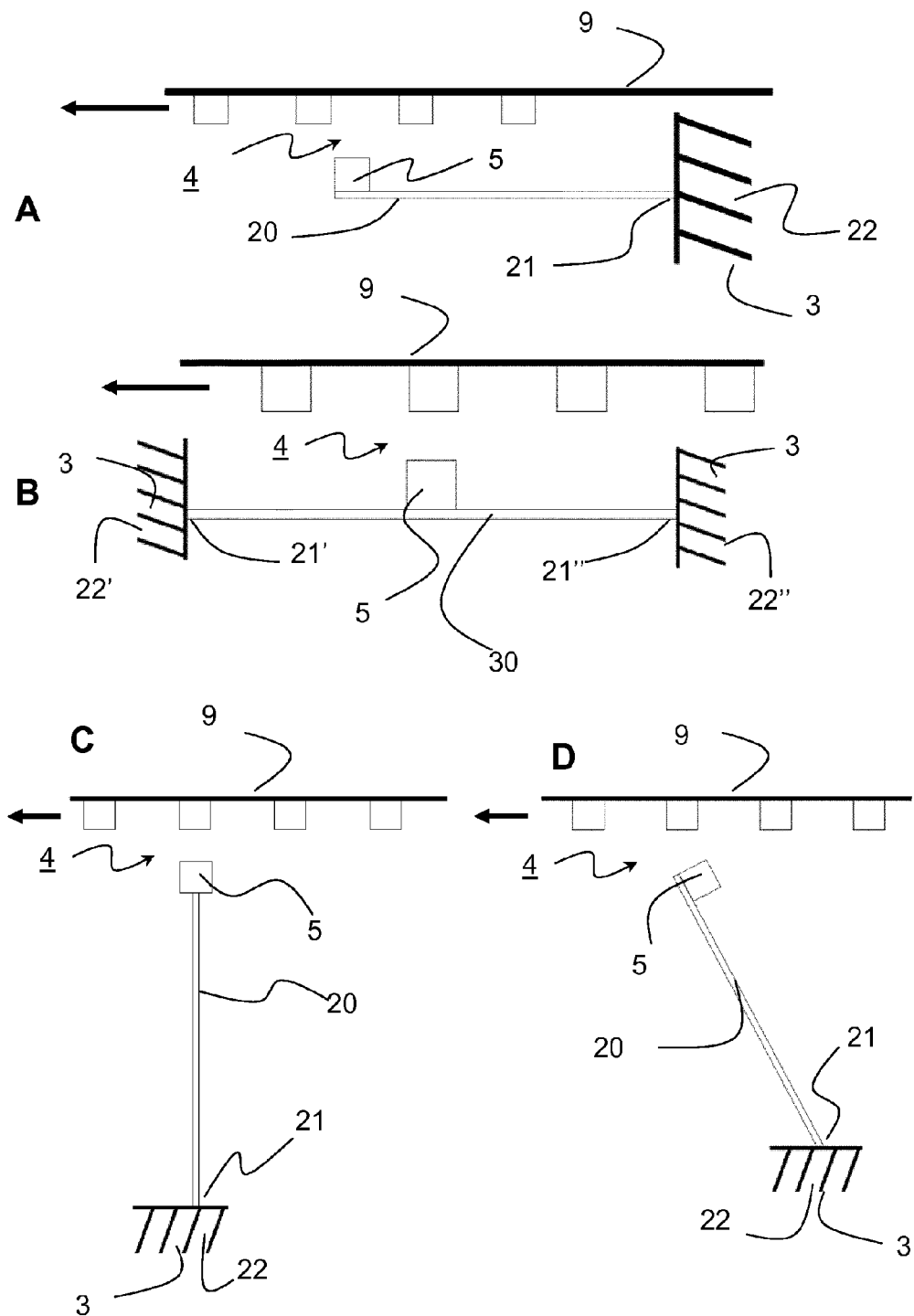
FIG. 11 shows alternative anchoring methods.

FIG. 11 illustrates alternative embodiments of anchoring the electricity generating member 2 to a first body 3, here, a second body 9 and having a varying field 4 and the cantilever 20 or bridge 30 with a field engagement part 5 anchored to an anchor 22 on a first body 3 at an anchor point 21.

The configurations in embodiment A and B result in a perpendicular deformation 60, i.e., the deformation of the cantilever 20 or bridge 30 is essentially perpendicular to the direction that the first body 3 and the second body 9 are arranged to move relatively to each other.

The configuration in embodiment C results in a parallel deformation 62, i.e., the deformation of the cantilever 20 is essentially in the same direction as the direction that the first body 3 and the second body 9 are arranged to move relatively to each other.

The configuration in embodiment D results in an angled deformation 64, i.e., the deformation of the cantilever 20 is essentially in the same direction as the direction that the first body 3 and the second body 9 are arranged to move relatively to each other.

Furthermore, embodiment C illustrates an embodiment, where the field engagement part 5 is placed symmetrically on the cantilever 20.

Figure 12:
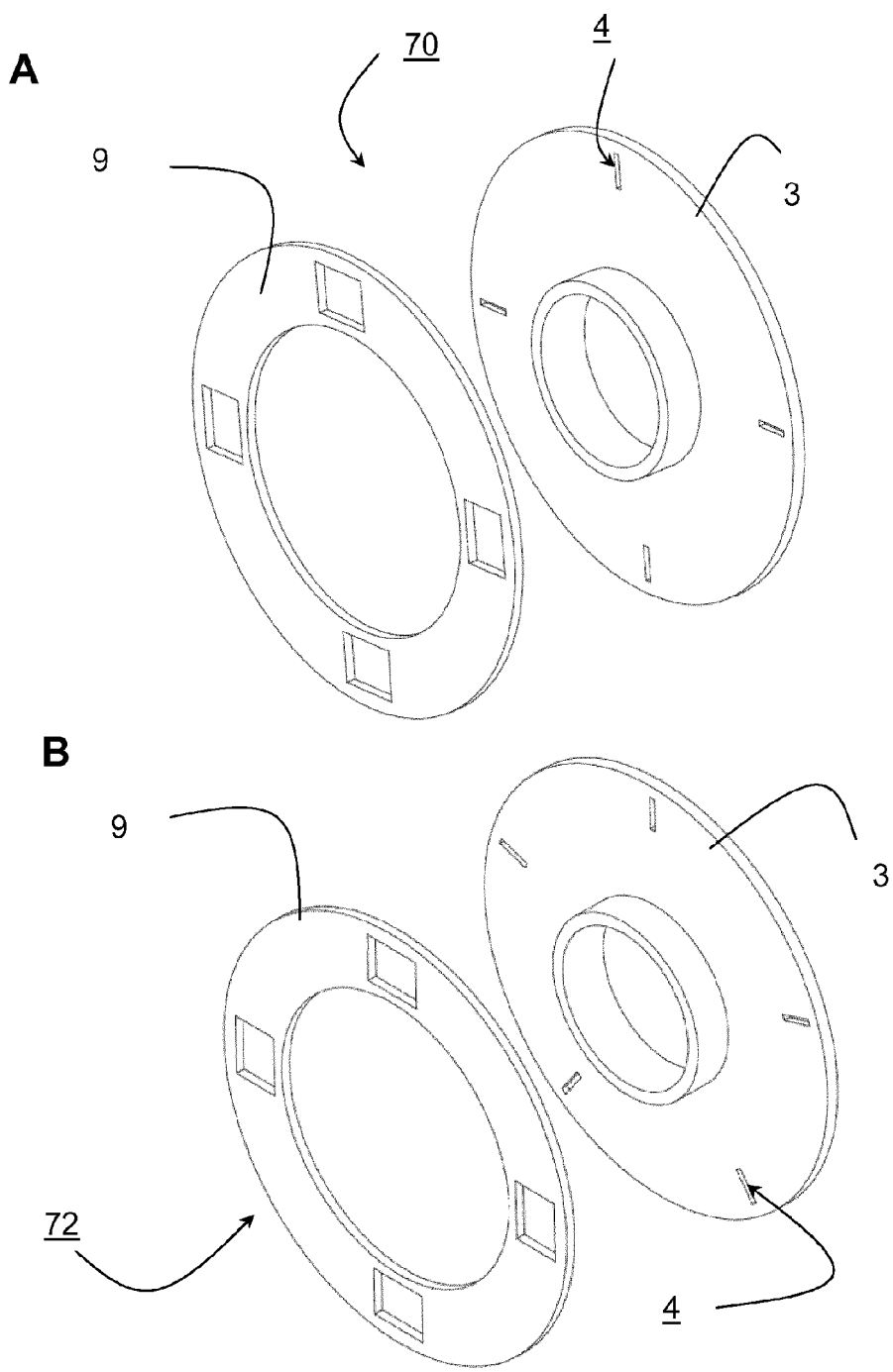
FIG. 12 illustrates a symmetrical arrangement and an asymmetrical arrangement.

FIG. 12 illustrates A) a symmetrical arrangement 70 of the generator unit where a varying field 4 and electricity generating members 2 are synchronously or symmetrically arranged against each other. It is understood from the figure that the electricity generating members 2 are to be placed in the holes in the second body 9 and that the varying field 4 is provided by units located in the first body 3.

FIG. 12 B) illustrates an asymmetrical arrangement 72 of the generator unit 1, where the varying field 4 on the first body 3 is asynchronously or asymmetrically arranged against the electricity generating members 2 to be placed in the holes in the second body 9.

From FIGS. 12A and 12B it is seen that the asymmetry can be introduced by having four electricity generating members 2 evenly distributed on a second body 9 and five, say magnets, distributed on a first body 3. A person skilled in the art will appreciate that asymmetries can be introduced by unevenly distributing say magnets or electricity generating members.

In a symmetrical arrangement 70 electricity generating members 2 may be distributed 90 degrees apart. In an asymmetrical arrangement 72, the electricity generating members may be arranged unevenly say with somewhere between 87- to 93-degrees apart, but not 90-degrees apart. The varying field 4 may be generated by magnets evenly— or unevenly—distributed with 6-degrees apart or about 6-degrees apart i.e. with 60 magnets in the configuration.

Figure 13:
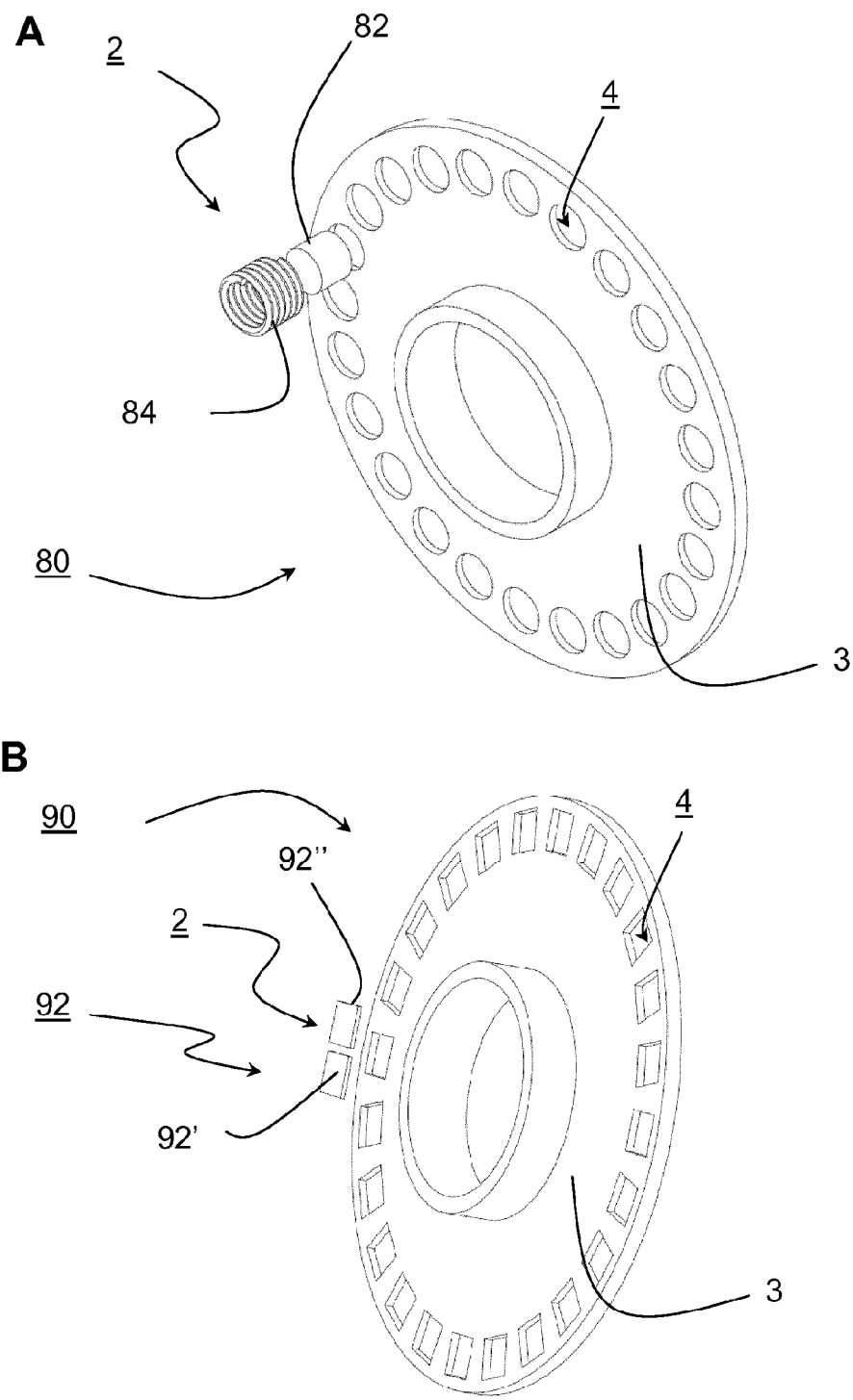
FIG. 13 illustrates embodiments of electromagnetic and electrostatic configurations.

FIG. 13 A) shows an electromagnetic configuration 80 where the electricity generating member 2 comprises a movable magnet 82 in a coil 84 arranged in a second body 9 (not shown). A varying field 4 is generated by a set of permanent magnets in the first body 3.

The principle used in the electromagnetic transduction is the generation of current in a conductor in a magnetic field.

The conductor may take the form of a coil, and electricity is generated by the relative motion of the conductor and a permanent magnet. The amount of electricity generated depends on the strength of the magnet, the velocity of the movement and the number of coil windings.

FIG. 13 B) shows an electrostatic configuration 90 where the varying field 4 is generated by differences in electric charge. One area may have a high electric charge and another area may have a lower electric charge. The electric charge may be embedded in the material or provided in separate areas. A polymer electric polarisation may be used to generate a permanent and varying electric field.

In this electrostatic configuration 90, the electricity generating member 2 may comprise an electrode pair 92 with two electrode plates 92', 92" on a second body 9 (not shown) that will experience a variable capacity thus generating a varying voltage potential and thus generating electricity.

Here, the electrostatic transduction exploits the relative motion of the electrode pairs 92 acting as capacitor plates. Some of the electrodes can be electrets, which is a charged dielectric material.

The work done against the electrostatic force between the electrode pairs 92 provides energy for harvesting. The electrets are embedded on the first body 3, which is negatively charged and is moving relative to the electrode pairs 92 on the second body 9. Since the electrets are negatively charged, positive charges will be induced on the two electrodes.

When one of the electrets is moving towards one of the electrode plates, the electrode plate 92' needs to be more positively charged, thus draining charges from the other electrode plate 92". This results in a current which can be harvested. As the charged electrets are moved/rotated, an alternating current will be generated.

Figure 14:
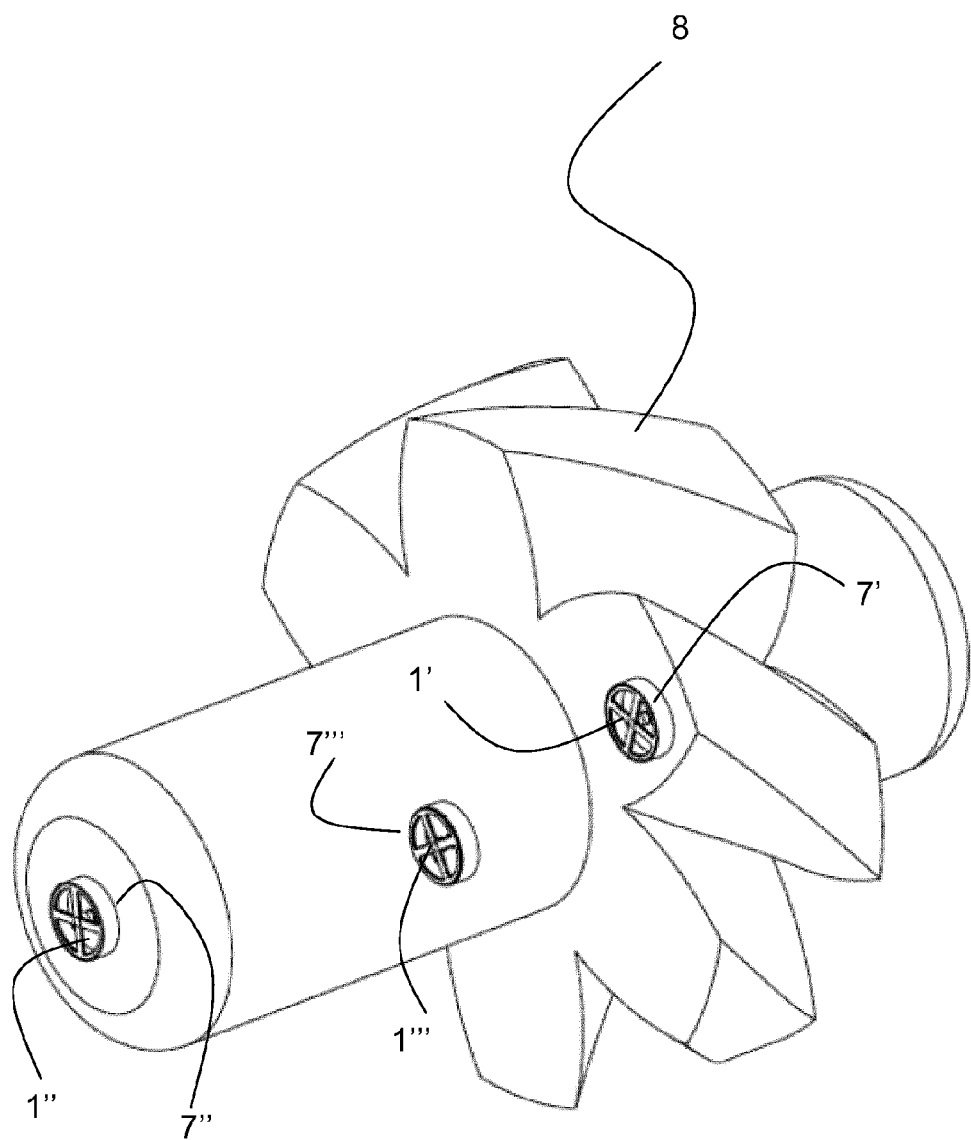
FIG. 14 shows how a generator unit can be placed on different locations of a rotating object to harvest energy from the motion of the object.

FIG. 14 illustrates different generator units 1', 1", 1''' being placed on an object 8 at different connection points 7',7",7''' to harvest energy in the form of electricity according to different locations on the object 8 as can be envisioned from the figure.

The invention claimed is:

1. A generator unit configured to harvest energy when being attached at a single point of contact to an object in motion, said generator unit comprising:
    a housing that includes first and second housing portions, wherein the first housing portion includes one connection member configured to attach and to provide a single point of contact to an object, and a shaft;
    a bearing attached to the shaft of the first housing portion;
    a first disc shaped body disposed within the first housing portion, the first disc shaped body having a center coupled to the bearing to facilitate rotation of the first disc shaped body about the shaft, wherein the first disc shaped body includes a sequence of permanent magnets placed along the periphery of the first disc shaped body that generate a varying magnetic field when the first disc shaped body is rotated about the shaft;
    a second disc shaped body coupled to a periphery of the second housing portion and centered with the shaft of the first housing portion, the second disc shaped body comprising at least one electricity generating member of a piezoelectric, an electromagnetic, an electrostatic, or a electrostrictive type, configured to produce electricity when mechanically deformed or moved, and a field engagement part coupled to the at least one electricity generating member, wherein the field engagement part is configured to be moved by the varying field generated by the first disc shaped body when the first body rotates about the shaft to thereby generate a varying mechanical deformation or movement of the electricity generating member without direct physical contact between the field engagement part and the first disc shaped body, and
    wherein a distance between the first and the second body is adjustable along the shaft of the support to thereby selectively control a mechanical effect the varying field generated by the first body has on the field engagement part.

2. The generator unit according to claim 1, wherein at least either the first or second body has a counterweight.

3. The generator unit according to claim 1, wherein the varying field is adjustable relative to the field engagement part by mechanically adjusting a bias distance between the field engagement part and varying field.

4. The generator unit according to claim 1, wherein the varying field is a magnetic field provided by at least one permanent magnet on one body and the field engagement part on the electricity generating member on the other body is a ferromagnetic material or a permanent magnet.

5. The generator unit according to claim 4, wherein the varying field is generated by a magnetic field with opposite magnetic orientations.

6. The generator unit according to claim 4, wherein the varying field is generated by a magnetic field with the same magnetic orientations.

7. The generator unit according to claim 2, wherein the counterweight is made of a non-ferromagnetic material.

8. The generator unit according to claim 1, wherein the varying field predominantly varies perpendicularly to the rotational plane.

9. The generator unit according to claim 8, wherein the generator unit is configured for adjusting the strength of a magnetic field engaging the field engagement part, preferably by means of reorganizing the density of magnetic field lines.

10. The generator unit according to claim 8, wherein the first body has an inner side facing the second body and an outer side comprising the counterweight.

11. The generator unit according to claim 10, wherein the generator unit is configured for having a counterweight with an adjustable inertia.

12. The generator unit according to claim 11, wherein a part of the counterweight is made of tungsten.

13. The generator unit according to claim 1, wherein the electricity generating member is a cantilever connected to a body.

14. The generator unit according to claim 1, wherein the electricity generating member is a bridge having two anchor points to a body.

15. The generator unit according to claim 13, wherein the electricity generating member is a membrane anchored to a body.

16. The generator unit according to claim 1, wherein the varying field and the field engagement part are configured to deform or move the electricity generating member bi-directionally or uni-directionally relatively to an equilibrium position or wherein the varying field and the field engagement part are configured to either repel or attract each other or alternatively repel and attract each other.

17. The generator unit according to claim 13, wherein the first body and the second body are configured to move relatively to each other as a rotation; preferably about a mutual axis.

18. The generator unit according to claim 17, wherein the varying field predominantly varies radially to the rotation.

19. The generator unit according to claim 1, said generator unit comprising multiple bodies and in between bodies, multiple varying fields with multiple electricity generating members.

20. The generator unit according to claim 1, where the support is a gimbal type support configured to support the bodies in a preferred orientation as the single connection member changes orientation in a relatively slow movement of an object compared to the energy harvesting motion.

21. The generator unit according to claim 1, said generator unit further comprising a housing with an interior configured to encapsulate the mentioned elements and an exterior with a single means of connection to an object.

22. The generator unit according to claim 1, said generator unit having a varying field and electricity generating members that are asymmetrically arranged against each other.

* * * * *